United States Patent [19]

Celler

[11] 4,249,962
[45] Feb. 10, 1981

[54] METHOD OF REMOVING CONTAMINATING IMPURITIES FROM DEVICE AREAS IN A SEMICONDUCTOR WAFER

[75] Inventor: George K. Celler, Lawrence, N.J.

[73] Assignee: Western Electric Company, Inc., New York, N.Y.

[21] Appl. No.: 74,443

[22] Filed: Sep. 11, 1979

[51] Int. Cl.³ .................................. H01L 21/265
[52] U.S. Cl. ............................ 148/1.5; 148/187; 219/121 L; 357/91; 427/53.1
[58] Field of Search ............... 148/1.5, 187; 357/91; 250/492 A; 219/121 L; 427/53.1

[56] References Cited

U.S. PATENT DOCUMENTS

| | | | |
|---|---|---|---|
| 3,457,632 | 7/1969 | Dolan et al. | 29/578 |
| 3,540,925 | 11/1970 | Athanas et al. | 117/217 |
| 3,622,382 | 11/1971 | Brack et al. | 117/201 |
| 3,663,308 | 5/1972 | Davey | 148/1.5 |
| 3,778,626 | 12/1973 | Robertson | 250/492 |
| 3,796,929 | 3/1974 | Nicholas et al. | 317/235 |
| 3,874,936 | 4/1975 | D'Hervilly et al. | 148/1.5 |
| 3,880,675 | 4/1975 | Tarui et al. | 148/1.5 |
| 3,948,694 | 4/1976 | Mills | 148/187 |
| 3,997,368 | 12/1976 | Petroff et al. | 148/1.5 |
| 4,004,950 | 1/1977 | Baruch et al. | 148/1.5 |
| 4,025,364 | 5/1977 | Smith | 148/1.5 |
| 4,047,974 | 9/1977 | Harari | 148/1.5 |
| 4,053,335 | 10/1977 | Hu | 148/174 |
| 4,053,925 | 10/1977 | Burr et al. | 357/64 |
| 4,055,444 | 10/1977 | Rao | 148/1.5 |
| 4,069,068 | 1/1978 | Beyer et al. | 148/1.5 |
| 4,076,558 | 2/1978 | Rupprecht et al. | 148/1.5 |
| 4,098,618 | 7/1978 | Crowder et al. | 148/1.5 |
| 4,131,487 | 12/1978 | Pearce et al. | 148/1.5 |
| 4,137,100 | 1/1979 | Zaleckas | 148/1.5 |
| 4,151,008 | 4/1979 | Kirkpatrick | 148/1.5 |
| 4,155,779 | 5/1979 | Auston et al. | 148/1.5 |

OTHER PUBLICATIONS

Beyer et al., IBM–Tech. Discl. Bull. 19(6), (1976) 2050.
Beyer et al. IBM–Tech. Discl. Bull. 20(8), (1978) 3122.
Bogardus et al., IBM–Tech. Discl. Bull. 16(4), (1973) 1066.
Campisano et al., Solid State Electronics, 21 (1978) 485.
Baeri et al. Phys. Rev. Letts. 41(18), (1978) 1246.
Buck et al., Surface Science, 35 (1973), 362–379.
Kutukova et al., Sov. Phys. Semicond., vol. 10, No. 3, (1976) 265.
Auston et al. "New Role for the Laser" Bell Laboratories Record, Jul.–Aug. 1979, pp. 187–191.
Poponiak et al., IBM–Tech. Discl. Bull., 19(6) 1976, 2052.

Primary Examiner—L. Dewayne Rutledge
Assistant Examiner—Upendra Roy
Attorney, Agent, or Firm—D. J. Kirk

[57] ABSTRACT

High energy ions are implanted at both the device areas (11—11) on a semiconductor wafer 10 to form electrical devices (15—15) and at areas (14—14) remote therefrom. The device areas (11—11) are then selectively laser recrystallized to repair damage caused by the ion implantation and the wafer (10) is placed in a furnace for a time and at a temperature sufficient to cause gettering of contaminating impurities to the damage remote areas (14—14).

20 Claims, 9 Drawing Figures

Fig. 5
- FORM AN APERTURED MASK 16 ON THE WAFER 10.
- IMPLANT IONS IN THE WAFER 10 TO FORM DEVICES 15-15 IN AREAS 11-11, AND AT AREAS 14-14 REMOTE THEREFROM.
- SELECTIVELY RECRYSTALLIZE THE DEVICE AREAS 11-11.
- HEAT THE WAFER 10 IN A FURNACE TO GETTER CONTAMINATING IMPURITIES TO THE REMOTE AREAS 14-14.

Fig. 6
- FORMING AN AMORPHOUS LAYER 41 OF SEMICONDUCTOR MATERIAL IN THE DEVICE AREAS 11-11 AND AT REMOTE LOCATIONS 14-14.
- SELECTIVELY RECRYSTALLIZING THE DEVICE AREAS 11-11.
- HEATING THE WAFER 10 IN A FURNACE TO CAUSE CONTAMINATING IMPURITIES TO MIGRATE TO THE REMOTE LOCATIONS 14-14.

METHOD OF REMOVING CONTAMINATING IMPURITIES FROM DEVICE AREAS IN A SEMICONDUCTOR WAFER

TECHNICAL FIELD

This invention is related to processing of semiconductor wafers. In particular, the invention is directed to removing contaminating impurities from device areas in the wafers.

BACKGROUND OF THE INVENTION

Semiconductor devices, such as transistors, integrated circuits or the like are normally fabricated by forming a multitude of circuits by selectively doping areas in a semiconductor wafer. Once formed, the wafer is particulated into a multitude of discrete devices or chips. From an economic standpoint, it is of the utmost importance to obtain the highest possible yield of acceptable devices from each wafer. Such high yields increase productivity and decrease the unit cost of each device and avoids expenditures on costly capital equipment. The number of acceptable devices on a wafer is particularly affected by the number of contaminating impurities (e.g., Cu, Ni, Fe, Au) on the wafers generated during the semiconductor growing and/or wafer processing steps.

To improve device yields, a number of different gettering techniques have been used in the prior art. Gettering, as it relates to semiconductor processing, is a technique whereby the crystal lattice of the semiconductor material is altered or damaged and the wafer subsequently heated. The heating of the wafer causes contaminating impurities to migrate towards, and be trapped in, the damaged areas. The damage can be induced by a variety of techniques such as mechanical abrading, ion implantation, electron or proton irradiation, or by diffusion of very high doses of impurities, such as phosphorus, into the wafer, to produce stress in the crystal with resultant high density of dislocations.

One such technique is disclosed in U.S. Pat. No. 4,131,487 to Pearce et al. which is assigned to the instant assignee. The Pearce patent discloses the gettering of contaminating impurities to the non-device side of a semiconductor wafer by raster scanning a laser beam thereat to produce lattice damage and strain therein. The wafer is then heated to produce a dislocation array adjacent the damaged regions to relieve the strain and attract contaminating impurities in the wafer away from the active side of the wafter. Additionally, Pearce et al. indicate that the laser beam may be directed at the active side of the wafer so long as the beam avoids those portions of that surface where the devices are to be formed.

Such a gettering technique has been most successful, in particular where the semiconductor devices are formed without damaging the crystal lattice by doping the surface thereof with relatively low concentration of impurities and heating the wafer to diffuse the dopant into the wafer. However, when the devices are formed by ion implantation, a very high concentration of diffused dopants or similar techniques, the device areas become damaged. To repair this damage, it has been a standard practice to heat the wafer in a furnace for an extended period of time at an elevated temperature. Since these techniques produce considerable lattice damage in the device areas, a substantial amount of undesirable impurities may be trapped in such regions during the heat treatment and will not migrate to the remote damaged areas resulting in reduced product yield.

Accordingly, there is a need for a technique for gettering contaminating impurities from device areas to areas remote therefrom where the device areas are damaged during the formation thereof.

SUMMARY OF THE INVENTION

The foregoing and other problems have been overcome by the instant method of fabricating a plurality of substantially contamination free device areas on a semiconductor wafer. The method comprises the steps of: (a) forming a plurality of device areas in the wafer wherein the device areas are damaged during the formation thereof; (b) forming damaged remote locations on the wafer to which contaminating impurities will migrate and be trapped upon application of heat to the wafer; (c) selectively recrystallizing the damaged device areas; and (d) heating the wafer for a time and at such a temperature to cause the contaminating impurities to migrate from the device areas to the remote locations.

Advantageously, the selective recrystallization of the device areas may be accomplished with a high energy beam such as a laser or electron beam.

Furthermore, the remote areas wherein the damage is formed may be that area along which the wafer will be particulated in a later processing step.

BRIEF DESCRIPTION OF THE DRAWINGS

FIGS. 5 to 8 are flow diagrams of the various embodiments of the instant invention.

DETAILED DESCRIPTION

The term single crystal or crystalline structure as used herein refers to a crystal structure wherein substantially all of the atoms of the crystal are in a single periodic array. However, it should be realized that most crystals will not have a perfect orientation but will have a number of imperfections that will disturb the order. An amorphous crystal structure is one in which the atoms are not arranged in a periodic array. However, some short range order usually exists between the nearest-neighbor atoms. A polycrystalline structure comprises many small crystals joined together in a random fashion. The size of each small crystal (grain, crystallite) is much larger than the spacing between neighboring atoms but smaller than the dimension of a typical device formed in the semiconductor wafer. In silicon the grain size is typically $10^{-6}$ to $10^{-4}$ cm (100 Å to 1 $\mu$m). Both amorphous and polycrystalline structures are considered to be "damaged".

It is well known to deposit amorphous semiconductor material on a semiconductor wafer using vapor deposition techniques or the like. Additionally, portions of the wafer may become amorphous during the formation of devices thereon. It is also well known to place a wafer with the amorphous portions thereon in a furnace for a time and at a temperature to heat or anneal the amorphous (damaged) material into a single crystal state.

Additionally, laser beams having predetermined energy densities have been scanned over the surface of an amorphous material to create (a) a single crystal layer or (b) a polycrystalline layer. For example, a beam from a Nd:YAG laser operating in the TEM$_\infty$ mode at 1.06 $\mu$m wavelength, a 6 KHz repetition rate, 110 nanosecond pulse length, focused to a spot of 40 $\mu$m in diameter as defined by 1/e light intensity points, has been used to recrystallize amorphous material. The substrate material was single crystal (100) silicon of one ohm-cm resistivity which was made amorphous by implanting $8 \times 10^{15}$ As ion/cm$^2$ at 100 keV using known ion implantation techniques. Following each pulse the laser beam was moved by 8 $\mu$m until the desired surface had been recrystallized.

For peak incident laser beam power density in each spot of 67 MW/cm$^2$ or higher the ion implanted regions changed to a single crystal state from the amorphous state. For peak incident power densities of 48 MW/cm$^2$ and 38 MW/cm$^2$ the amorphous layer partially changed into polycrystalline material.

As hereinbefore indicated when semiconductor wafers having amorphous layers thereon are heated in a furnace, the amorphous layers readily become crystalline. However, polycrystalline layers on the same wafer strongly resist the change to a crystalline state.

Figure 1:
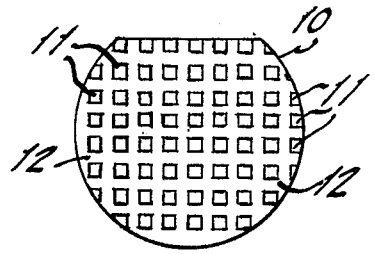
FIG. 1 is a plan view of a semiconductor wafer having a plurality of circuit devices formed therein.

FIG. 1 depicts a semiconductor wafer 10 (e.g., silicon, germanium, gallium arsenide or the like) having a multitude of electrical device areas 11-11 pictorally indicated as rectangles thereon. The device are 11-11 are separated by areas 12-12 in both the horizontal and vertical directions.

The device areas 11-11 are typically fabricated by forming an apertured mask on the surface of the wafer 10 using known photolithographic techniques and selectively doping the wafer through the apertures. Doping may be accomplished by vapor depositing dopant materials in the apertures and placing the wafer 10 in a furnace for a predetermined time and at a temperature that will diffuse the dopant into the wafer to a predetermined depth.

Alternatively, the wafer may be selectively implanted with ions from an ion beam scanned over the surface of the masked wafer as shown in U.S. Pat. No. 3,778,626 which is assigned to the instant assignee. The ions passing through the mask apertures will be implanted to a predetermined depth determined by the energy imparted to the ions.

The use of ion implantation techniques has proven most effective in semiconductor device fabrication. However, such implantation has been found to damage the device areas of the semiconductor material. The semiconductor material may become amorphous if the implanted ion dose is sufficiently large, if not, the crystalline semiconductor will be left with a high number of defects. Such damage requires that the wafer 10 be heated in a furnace for a period of time to recrystallize or heal the damage. The heating associated with such recrystallization may cause fast diffusion of contaminating impurities such as Cu, Ni, Fe, Au, etc., into the device areas 11-11 where the damage had occurred resulting in a high percentage of unacceptable devices.

In one embodiment of the present invention the foregoing problem has been overcome by (a) intentionally damaging the wafer 10 at locations remote from the damaged device areas 11-11 (e.g., areas 12-12) to alter the crystalline structure of the semiconductor material at those remote locations; and (b) selectively recrystallizing the damaged device areas with a beam of high energy radiation prior to subjecting the entire wafer 10 to furnace heating. The selective recrystallization of the device areas 11-11 removes the damage to the crystalline structure induced during the device fabrication. Thus, when the wafer 10 is subjected to elevated temperatures in subsequent fabrication steps, the contaminating impurities in and about the device areas 11-11 will migrate to and be trapped in the damaged remote locations.

Figure 2:
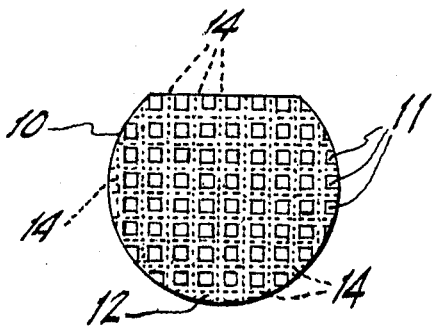
FIG. 2 is a plan view of a semiconductor wafer having a plurality of circuit device areas as well as damaged remote locations.
Figure 3:
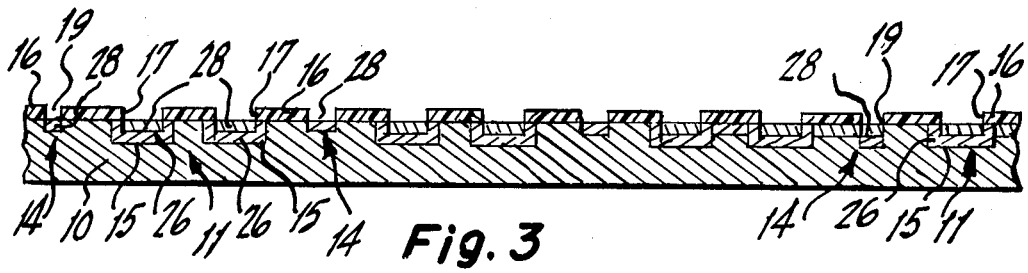
FIGS. 3 and 4 are partial cross-sectional views of a semiconductor wafer during processing.

FIG. 2 is a plan view of the semiconductor wafer 10 on which devices in the areas 11-11 have been fabricated and the non-device separation areas 12-12 are selectively damaged at remote locations 14-14. The damage may form a continuous path or may be at individual spaced locations 14-14 as shown in FIG. 2. FIG. 3 is an enlarged, partial cross-sectional view of the wafer 10 during fabrication of devices 15-15 in device areas 11-11. A mask layer 16 (e.g., oxide and nitride layers) having a first group of apertures 17-17 therein is formed on the surface of the semiconductor wafer 10. The device areas 11-11 are exposed through the apertures 17-17. Additionally, a second group of apertures 19-19 is formed in the mask layer 16 exposing locations 14-14 between, or remote from, the device areas 11-11.

In operation, as set forth in the flow diagram in FIG. 5, the mask layer 16 is formed on the wafer 10 with the apertures 17-17 aligned over previously doped areas 26-26. The wafer 10 is then subjected to controlled amounts of dopant ions (e.g., $10^{16}$ As$^+$ ions/cm$^2$; $10^{16}$ P+ ions/cm$^2$) fired at high velocity by an ion implantation apparatus (not shown) or by depositing dopant material in the apertures 17-17 and heating the wafer 10 to drive the dopant into the wafer to a predetermined depth. The mask layer 16 permits the ions to enter the silicon wafer 10 only through the apertures 17-17 and 19-19. The ions become embedded in the crystalline material of the wafer 10 as a layer 28 at the device areas 11-11 as well as the remote locations 14-14, but their high speed entry disrupts (damages) the crystal structure in the layer of the material. The implanted portions of the wafer 10 become disordered, or amorphous. Normally, the ion damaged material is heated (annealed) in a furnace, typically for about one hour at 1,000 degrees C. During this process, the atoms of the semiconductor shift positions until they are once again in a regular lattice structure. However, such furnace heating would also anneal the damage at the remote locations 14-14 and substantially negate or substantially decrease the diffusion of the contaminating impurities to the remote locations.

The instant method incorporates a selective laser heating step to recrystallize only the device areas 11-11 while permitting the damage to remain at the remote locations 14-14. The selective laser recrystallization technique is described in detail in an article titled "New role for the laser" by D. H. Auston et al. in the *Bell Laboratories Record*, July/August 1979, pages 186 to 191 which is incorporated herein by reference. Essentially, the laser is selectively directed at only the device areas 11-11 formed in the wafer 10 and the intense light of the laser beam is absorbed near the surface of the wafer 10. The effect is different from that in a furnace for the laser delivers heat rapidly and selectively; the laser beam can heat an area as small as a few micrometers in diameter. Since the layer 28 being heated is very thin compared to the thickness of the wafer 10, it also cools quickly and the bulk of the wafer outside the device areas 11-11 is not heated significantly.

Although the exemplary embodiment describes the use of ion implantation to both form the devices 11-11 and damage the remote areas 14-14, other techniques may be used. For instance the damage to the device areas 11-11 may be caused by particle beams (e.g., electrons, protons), diffusion of high concentrations of dopant or the like and any of these techniques can also be used to impart damage to the remote locations 14-14. Other techniques such as electron beam, laser damage or mechanical damage such as scraping, scribing or abrasive jet machining may be used to form the damage at the remote areas 14-14.

After the device areas 11-11 have been selectively recrystallized, typically the mask 16 is removed and the wafer 10 is cleaned and an oxide grown over the full surface thereof to cover the areas 11-11 and 14-14 exposed through the apertures 17-17 and 19-19, respectively. The oxide may be grown by placing the wafer 10 in a conventional furnace in an oxygen atmosphere at 1,000 degrees C. for one hour. Such furnace heating, in addition to growing the oxide, will also cause any fast diffusing contaminating impurities, (e.g., Cu, Ni, Fe, Au) to migrate to the damaged remote locations 14-14 which act as sinks and trap the impurities therein while the implanted dopant material, which is slow diffusing, remains in the devices 15-15.

Such gettering action is most effective when the damage at the remote locations 14-14 caused by the ion implantation is maximized by using a very high ion dose and high ion energy and when the thermal treatment is unable to anneal all the damage leaving dislocations and dislocation loops which permits additional gettering of undesired impurities to the remote areas 14-14 during subsequent heating operations. High doses of ions of significantly different size than the lattice atoms (e.g., $2 \times 10^{16} p^+$ ions implanted into Si at 30 keV) are particularly effective in generating large density of so called misfit dislocations which are very resistant to thermal annealing. Such dislocation arrays will only appear in the remote areas. Such dislocation arrays will only appear in the remote areas which were not recrystallized with a pulsed laser beam preceding the thermal treatment.

After heating the wafer 10 in the furnace, conventional processing steps such as defining windows for metallization, etching, depositing metal contacts, etc, are accomplished to complete the fabrication of the devices 15-15 in areas 11-11.

Although the remote locations 14-14 damaged by the implanted ions are depicted in a grid-like array in FIG. 2, such a pattern is not required, as the damage may be generated in any area of the wafer 10 as long as it is remote from the device areas 11-11. However, it has been found to be most advantageous to form the damage as shown in the grid-like array for when the device areas 11-11 have been completely fabricated, the wafer 10 will be particulated by well known scribing and breaking techniques in the same pattern. Accordingly, the remote damaged locations 14-14 used in the gettering process as a sink for the contaminating impurities would not have been used for device fabrication and those areas are removed, along with the contaminating impurities, during the scribing and breaking of the wafer 10.

Figure 4:
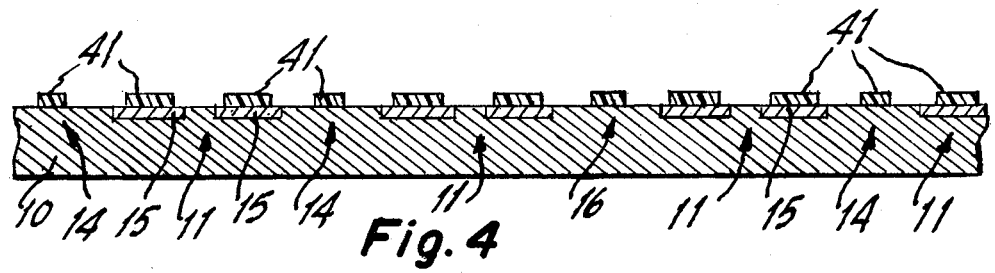

A further embodiment directed to removing contaminating impurities from the devices 11-11 is depicted in FIGS. 4 and 6. The devices 15-15 in the device areas 11-11 may have been formed in the wafer 10 using one of the aforementioned techniques such as ion implantation, diffusion or the like. A doped amorphous layer 41 of the same or similar material as that of the single crystal semiconductor wafer 10 is deposited on the wafer 10 as shown in FIG. 4 using masking techniques described in reference to FIG. 3. The device areas 11-11 may be formed, at least partially, in the amorphous layer 41. A high energy laser beam is then selectively directed at the device areas 11-11 to recrystallize the amorphous layers 41 associated with the device areas 11-11. The wafer 10 is then placed in a furnace for a time and at such a temperature to cause the fast diffusing contaminating impurities in or about the device areas 11-11 to be gettered to the amorphous layer 41 in the remote areas 14-14.

Figure 7:
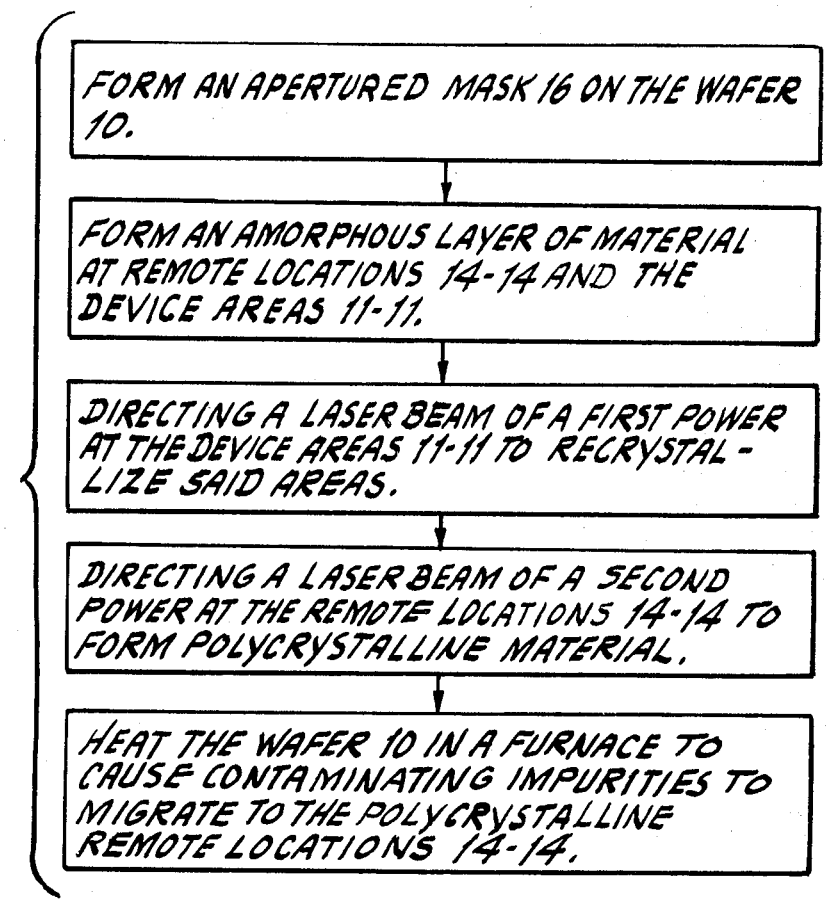

A further embodiment is depicted in FIG. 7 wherein an amorphous layer 41 is created on the surface of a wafer 10 by deposition (FIG. 4) or ion implantation (FIG. 3) to form device areas 11-11, at least partially, in that layer. Additionally, an amorphous layer 41 of the semiconductor material is deposited on, or implanted in the remote locations 14-14. A beam of high energy radiation of a first power density is scanned over the amorphous layer in the device areas 11-11 to cause the amorphous material to become substantially crystalline. A beam of high energy radiation of a second power density, lower than the first power density, is scanned over the remote locations 14-14 to alter the amorphous material thereat to form a substantial polycrystalline structure. The wafer 10 is then subjected to elevated temperatures in a furnace for a time and temperature to cause the impurities in the wafer to migrate to the polycrystalline material at the remote locations 14-14.

Figure 9:
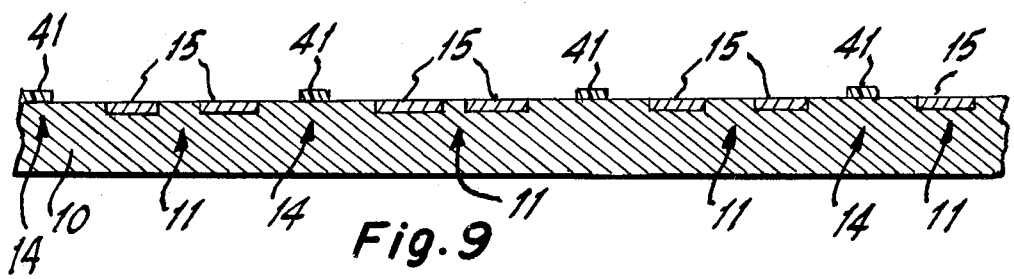
FIG. 9 is a partial cross-sectional view of a semiconductor wafer processed in accordance with the embodiment set forth in the block diagram of FIG. 8.
Figure 8:
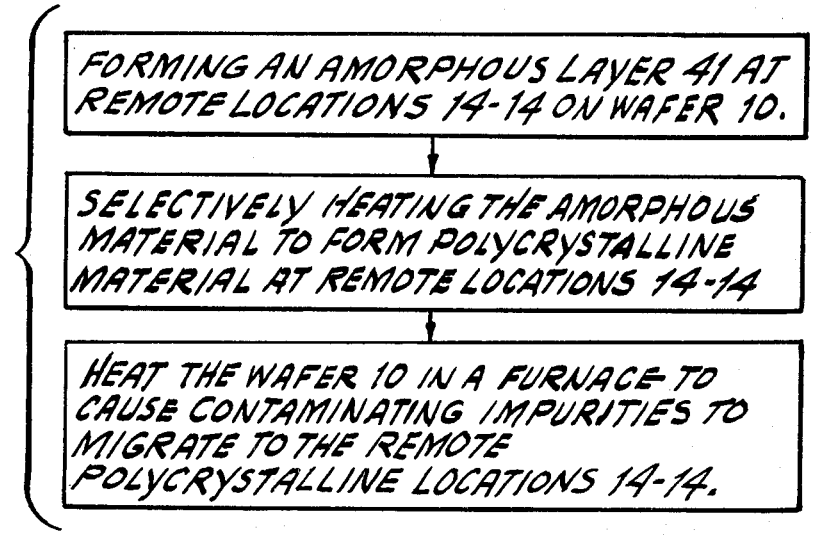

An additional embodiment of the instant invention is shown in FIGS. 8 and 9 wherein an amorphous layer 41 is formed on the surface of the wafer 10 at locations 14-14 which are remote from device areas 11-11. FIG. 9 depicts an amorphous material 41 deposited on wafer 10 by vapor deposition techniques. However, an amorphous layer may be formed in the wafer 10 using ion implantation, electron beam irradiation, diffusing in a high dopant concentration, etc. as described in relation to FIG. 3. A pulsed beam of high energy radiation having a power density sufficient to form polycrystalline material, as hereinbefore described, is directed at the locations 14-14 remote from the device areas 11-11. The wafer 10 is then heated at an elevated temperature to getter impurities in or about the device areas 11-11 to the remote polycrystalline areas 14-14.

One skilled in the art may make various changes and substitutions to the embodiments described herein without departing from the spirit and scope of the invention.

What is claimed is:

1. A method of fabricating a plurality of device areas, substantially free of contaminating impurities and damage, in a semiconductor wafer, comprising the steps of:
   (a) forming a plurality of device areas in the wafer wherein the device areas may be damaged during the formation thereof and may include contaminating impurities;
   (b) forming damaged remote locations on the wafer to which the contaminating impurities will migrate and be trapped upon application of heat to the wafer;

(c) selectively recrystallizing the damaged device area; and
(d) heating the wafer for a time and at such a temperature to cause the contaminating impurities to migrate from the device areas to the remote locations.

2. The method as set forth in claim 1, wherein:
the device areas are formed by ion implantation.

3. The method as set forth in claim 1, wherein:
the remote locations are damaged by ion implantation.

4. The method as set forth in claim 1, wherein:
the devices are formed by diffusing a high concentration of dopants therein.

5. The method as set forth in claim 1, wherein:
the remote locations are damaged by a particle beam.

6. The method as set forth in claim 1, wherein:
the damaged remote locations are formed by depositing amorphous semiconductor material at said locations.

7. The method as set forth in claim 1, which is characterized by:
depositing an amorphous layer of doped semiconductor material on the surface of the wafer and forming at least a portion of each device area in said layer.

8. The method as set forth in claim 1, wherein:
the recrystallizing step is accomplished with a beam of high energy radiation.

9. The method as set forth in claim 1, wherein:
the damage at the remote locations form a grid pattern on the wafer which separates the device areas; and
particulating the semiconductor wafer along the grid pattern to remove contaminating impurities migrating thereto.

10. The method as set forth in claim 1, wherein the damaged remote locations on the wafer are amorphous, the method further comprising the step of:
directing a beam of high energy at said remote locations to change the amorphous material to polycrystalline material.

11. The method as set forth in claim 8, wherein:
the beam of high energy radiation is an electron beam.

12. The method as set forth in claim 8, wherein:
the beam of high energy radiation is a laser beam.

13. The method as set forth in claim 9, characterized by:
particulating the wafer along the grid pattern upon completion of the device fabrication.

14. The method as set forth in claim 10, wherein:
the beam of high energy radiation is an electron beam.

15. The method as set forth in claim 10, wherein:
the beam of high energy radiation is a laser beam.

16. A method of fabricating a plurality of substantially contamination free devices on a semiconductor wafer, comprising the steps of:
(a) forming a plurality of device areas in the wafer wherein the device areas are damaged during the formation thereof;
(b) forming amorphous semiconductor material at areas remote from the devices;
(c) directing a high energy beam at the amorphous material to form polycrystalline material at tthe remote areas;
(d) heating the wafer for a time and temperature to cause contaminating impurities to migrate from the device areas to the remote areas.

17. The method as set forth in claim 16, wherein:
the amorphous semiconductor material is formed by ion implantation.

18. The method, as set forth in claim 17, wherein:
the amorphous semiconductor material is selectively vapor deposited at the remote areas.

19. The method as set forth in claim 16, wherein:
the high energy beam is an electron beam.

20. The method as set forth in claim 16, wherein:
the high energy beam is a laser beam.

* * * * *

UNITED STATES PATENT AND TRADEMARK OFFICE
CERTIFICATE OF CORRECTION

PATENT NO. : 4,249,962
DATED : February 10, 1981
INVENTOR(S) : G. K. Celler

It is certified that error appears in the above—identified patent and that said Letters Patent is hereby corrected as shown below:

In the specification, Column 3, line 34, "are" should read --areas--. Column 5, lines 45 through 47, "annealing. Such dislocation arrays will only appear in the remote areas. Such dislocation arrays will only appear in the remote areas which" should read --annealing. Such dislocation arrays will only appear in the remote areas which--.

Column 8. claim 16, line 27, "tthe" should read -- the --.

Signed and Sealed this

Ninth Day of June 1981

[SEAL]

Attest:

RENE D. TEGTMEYER

Attesting Officer     Acting Commissioner of Patents and Trademarks